(12) United States Patent
Kim et al.

(10) Patent No.: US 12,712,153 B2
(45) Date of Patent: Aug. 18, 2026

(54) IMPEDANCE MATCHING CIRCUIT, POWER SUPPLY APPARATUS, AND PLASMA PROCESSING EQUIPMENT INCLUDING SAME

(71) Applicant: SEMES CO., LTD., Cheonan-si (KR)

(72) Inventors: Hyun Jin Kim, Daegu (KR); Jung Hwan Lee, Ansan-si (KR); Galstyan Ogsen, Cheonan-si (KR); Sung Suk Wi, Yongin-si (KR); Min Keun Bae, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 761 days.

(21) Appl. No.: 18/080,700

(22) Filed: Dec. 13, 2022

(65) Prior Publication Data

US 2023/0197411 A1 Jun. 22, 2023

(30) Foreign Application Priority Data

Dec. 20, 2021 (KR) ........................ 10-2021-0182568

(51) Int. Cl.
*H01J 37/32* (2006.01)
*H03H 7/38* (2006.01)

(52) U.S. Cl.
CPC .. *H01J 37/32183* (2013.01); *H01J 37/32091* (2013.01); *H03H 7/38* (2013.01);
(Continued)

(58) Field of Classification Search
CPC ........... H01J 37/32183; H01J 37/32091; H01J 2237/24564; H01J 2237/24585;
(Continued)

(56) References Cited

U.S. PATENT DOCUMENTS 4,557,819 A * 12/1985 Meacham ......... H01J 37/32082 156/345.46
4,629,887 A * 12/1986 Bernier .................... H05H 1/46 250/251

(Continued)

FOREIGN PATENT DOCUMENTS

CN 102568993 7/2012
JP 2005-071872 3/2005

(Continued)

OTHER PUBLICATIONS

Office Action of the Japan Patent Office dated Mar. 12, 2024.

(Continued)

*Primary Examiner* — Abdullah A Riyami
*Assistant Examiner* — Syed M Kaiser

(57) ABSTRACT

An impedance matching circuit, which is provided for quick impedance matching, a power supply apparatus, and a plasma processing equipment including the same are provided. The impedance matching circuit includes a parallel capacitor array connected to a radio frequency (RF) power supply to generate a RF signal, and a series capacitor array connected to the RF power supply in series, wherein the parallel capacitor array or the series capacitor array includes a mechanical vacuum variable capacitor and an electrical switch capacitor module connected to the mechanical vacuum variable capacitor in parallel.

13 Claims, 16 Drawing Sheets

(52) U.S. Cl.
CPC ................ *H01J 2237/24564* (2013.01); *H01J 2237/24585* (2013.01); *H01J 2237/3343* (2013.01)

(58) Field of Classification Search
CPC ......... H01J 2237/3343; H01J 37/32174; H01J 2237/3321; H01J 2237/334; H03H 7/38; H03H 7/40
See application file for complete search history.

(56) References Cited

U.S. PATENT DOCUMENTS

| | | | | |
|---|---|---|---|---|
| 9,715,996 | B2 | 7/2017 | Son | |
| 9,984,959 | B2 | 5/2018 | Shuto et al. | |
| 10,115,564 | B2 | 10/2018 | Marakhtanov et al. | |
| 10,580,623 | B2 * | 3/2020 | Ye ..................... | H01J 37/32577 |
| 11,081,316 | B2 | 8/2021 | Ulrich et al. | |
| 2012/0075033 | A1 * | 3/2012 | Ouyang ............ | H01J 37/32183 333/32 |
| 2012/0168081 | A1 | 7/2012 | Son | |
| 2016/0095196 | A1 * | 3/2016 | Chen ........................ | H05H 1/46 315/111.21 |
| 2020/0411288 | A1 * | 12/2020 | Wang ................ | H01J 37/32935 |

FOREIGN PATENT DOCUMENTS

| | | | | |
|---|---|---|---|---|
| JP | 2012-142285 | | 7/2012 | |
| JP | 2017-069823 | | 4/2017 | |
| KR | 101054558 | B1 * | 8/2011 | ........ H01J 37/32174 |
| KR | 20150039119 | A * | 4/2015 | ............... H03H 7/38 |
| KR | 10-2016-0106499 | | 9/2016 | |
| KR | 10-2017-0044010 | | 4/2017 | |

OTHER PUBLICATIONS

Office Action from the Japan Patent Office dated Oct. 31, 2023.

Office Action from the China National Intellectual Property Administration dated Nov. 22, 2025.

* cited by examiner

IMPEDANCE MATCHING CIRCUIT, POWER SUPPLY APPARATUS, AND PLASMA PROCESSING EQUIPMENT INCLUDING SAME

CROSS REFERENCE TO RELATED APPLICATION

The present application claims priority to Korean Patent Application No. 10-2021-0182568, filed Dec. 20, 2021, the entire contents of which is incorporated herein for all purposes by this reference.

BACKGROUND OF THE INVENTION

Field of the Invention

The present disclosure relates generally to an impedance matching circuit, a power supply apparatus, and plasma processing equipment including the same.

Description of the Related Art

A semiconductor (or display) manufacturing process is a process for manufacturing a semiconductor device on a substrate (e.g., wafer), and for example, includes exposing, depositing, etching, ion implanting, cleaning, etc. In order to perform each manufacturing process, semiconductor manufacturing facilities performing each process are provided in a clean room of a semiconductor manufacturing plant, and a process is performed on a substrate inserted into the semiconductor manufacturing facilities.

In the substrate manufacturing process, processes using plasma, for example, etching, depositing, etc. are widely used. A plasma processing apparatus performing a plasma process may perform the process while changing various process conditions such as process gas, temperature, pressure, a frequency of radio frequency (RF) signal for generating plasma, power, etc.

Meanwhile, as a high-level stack structure is required for a substrate such as a 3D NAND flash, the number of steps of the plasma process increases, and change of a plasma state occurs in step changing. The plasma state change causes impedance change and impedance causes impedance mismatching may occur. A plasma processing equipment performs the impedance matching to respond to the impedance mismatching, and there is a demand for the power supply apparatus for quick matching.

SUMMARY OF THE INVENTION

Therefore, an embodiment of the present disclosure provides an impedance matching circuit, which is configured to achieve quick impedance matching, a power supply apparatus, and plasma processing equipment including the same.

The technical problem of the present disclosure is not limited to the above mention, and other problem not mentioned will be clearly understood by those skilled in the art from the description below.

According to the present disclosure, an impedance matching circuit including: a parallel capacitor array connected to a radio frequency (RF) power supply to generate a RF signal; and a series capacitor array connected to the RF power supply in series, wherein the parallel capacitor array or the series capacitor array may include a mechanical vacuum variable capacitor and an electrical switch capacitor module connected to the mechanical vacuum variable capacitor in parallel.

According to an embodiment of the present disclosure, the parallel capacitor array may include: a parallel mechanical vacuum variable capacitor; and a plurality of parallel electrical switch capacitor modules connected to the parallel mechanical vacuum variable capacitor in parallel, wherein each of the parallel electrical switch capacitor modules may include: a parallel fixed capacitor having a fixed capacitance; and a parallel switch connected to the parallel fixed capacitor in series.

According to the embodiment of the present disclosure, the parallel mechanical vacuum variable capacitor has a capacitance larger than the parallel fixed capacitor.

According to the embodiment of the present disclosure, the series capacitor array may include: a series mechanical vacuum variable capacitor; and a plurality of series electrical switch capacitor modules connected to the series mechanical vacuum variable capacitor in parallel, wherein each of the plurality of the series electrical switch capacitor modules may include: a series fixed capacitor having a fixed capacitance; and a series switch connected to the series fixed capacitor in series.

According to the embodiment of the present disclosure, the series mechanical vacuum variable capacitor may have a capacitance larger than the series fixed capacitor.

A power supply apparatus of plasma processing equipment according to the embodiment of the present disclosure may include: a first power supply part including a first radio frequency (RF) power supply configured to generate a first RF signal, a first matching circuit connected to the first RF power supply, and a first power transfer circuit configured to transfer the first RF signal to a plasma load; a second power supply part including a second RF power supply configured to generate a second RF signal, a second matching circuit connected to the second RF power supply, and a second power transfer circuit configured to transfer the second RF signal to the plasma load; and a decoupling part configured to remove interference between the first power supply part and the second power supply part.

Each of the first matching circuit and the second matching circuit may include a mechanical vacuum variable capacitor and a plurality of electrical switch capacitor modules connected to the mechanical vacuum variable capacitor in parallel.

According to the embodiment of the present disclosure, the decoupling part may include: a first decoupling inductor connected to the first matching circuit and the first power transfer circuit while being located therebetween; a second decoupling inductor connected to the first matching circuit and the first power transfer circuit while being located therebetween and coupled to the first decoupling inductor in a mutually magnetic coupling manner; and a decoupling capacitor connected to the first matching circuit and the second matching circuit.

According to the embodiment of the present disclosure, the first matching circuit may include: a first parallel capacitor array coupled to the first RF power supply and an earthing, and including a plurality of capacitors connected to each other in parallel; and a first series capacitor array coupled to the first RF power supply and the decoupling part, and including a plurality of capacitors connected to the parallel capacitor array in series. The second matching circuit may include: a second parallel capacitor array connected to the second RF power supply and an earthing, and including a plurality of capacitors connected to each other in parallel; and a second series capacitor array connected to the second RF power supply and the power transfer circuit, and including a plurality of capacitors connected to the second parallel capacitor array in series.

According to the embodiment of the present disclosure, the first parallel capacitor array may include: a parallel mechanical vacuum variable capacitor; and a plurality of parallel electrical switch capacitor modules connected to the parallel mechanical vacuum variable capacitor in parallel. The first series capacitor array may include: a series mechanical vacuum variable capacitor; and a plurality of series electrical switch capacitor modules connected to the series mechanical vacuum variable capacitor in parallel.

According to the embodiment of the present disclosure, each of the parallel electrical switch capacitor modules may include: a parallel fixed capacitor having a fixed capacitance; and a parallel switch connected to the parallel fixed capacitor in series, and each of the series electrical switch capacitor modules may include: a series fixed capacitor having a fixed capacitance; and a series switch connected to the series fixed capacitor in series.

According to the embodiment of the present disclosure, the parallel mechanical vacuum variable capacitor may have a capacitance larger than the parallel fixed capacitor, and the series mechanical vacuum variable capacitor may have a capacitance larger than the series fixed capacitor.

According to the embodiment of the present disclosure, the first matching circuit may include: a fixed shunt capacitor coupled to the first RF power supply and an earthing; a first series capacitor array coupled to the first RF power supply and the fixed shunt capacitor, and including a plurality of capacitors connected to each other in parallel; and a second series capacitor array coupled to the fixed shunt capacitor and the decoupling part, and including a plurality of capacitors connected to each other in parallel.

According to the embodiment of the present disclosure, the first series capacitor may include a first mechanical vacuum variable capacitor and a plurality of first parallel electrical switch capacitor modules connected to the first mechanical vacuum variable capacitor in parallel, and the second series capacitor may include a second mechanical vacuum variable capacitor and a plurality of second parallel electrical switch capacitor modules connected to the second mechanical vacuum variable capacitor in parallel, wherein each of the first parallel electrical switch capacitor modules may include a first fixed capacitor and a first switch connected to the first fixed capacitor in series, and each of the second parallel electrical switch capacitor modules may include a second fixed capacitor and a second switch connected to the second fixed capacitor in series.

The plasma processing equipment according to the present disclosure may include a processing chamber configured to perform processing with respect to a substrate; and a power supply apparatus configured to supply power to the processing chamber to generate plasma.

The power supply apparatus may include: a first power supply part including a first radio frequency (RF) power supply configured to generate a first RF signal, a first matching circuit connected to the first RF power supply, and a first power transfer circuit configured to transfer the first RF signal to a plasma load; a second power supply part including a second RF power supply configured to generate a second RF signal, a second matching circuit connected to the second RF power supply, and a second power transfer circuit configured to transfer the second RF signal to the plasma load; and a decoupling part configured to remove interference between the first power supply part and the second power supply part, wherein each of the first matching circuit and the second matching circuit may include a mechanical vacuum variable capacitor and a plurality of electrical variable capacitor modules connected to the mechanical vacuum variable capacitor in parallel, and when a process condition of the processing chamber is changed, as the electrical variable capacitor modules are controlled while a capacitance of the mechanical vacuum variable capacitor is fixed, an impedance of each of the first matching circuit and the second matching circuit may be adjusted.

According to the embodiment of the present disclosure, the first matching circuit may include: a first parallel capacitor array including a plurality of capacitors connected to each other in parallel; and a first series capacitor array including a plurality of capacitors connected to the parallel capacitor array in series, and the second matching circuit may include: a second parallel capacitor array including a plurality of capacitors connected to each other in parallel; and a second series capacitor array including a plurality of capacitors connected to the second parallel capacitor array in series.

According to the embodiment of the present disclosure, the first parallel capacitor array may include: a parallel mechanical vacuum variable capacitor; and a plurality of parallel electrical switch capacitor modules connected to the parallel mechanical vacuum variable capacitor in parallel, and the first series capacitor array may include: a series mechanical vacuum variable capacitor; and a plurality of series electrical switch capacitor modules connected to the series mechanical vacuum variable capacitor in parallel.

According to the embodiment of the present disclosure, each of the parallel electrical switch capacitor modules may include: a parallel fixed capacitor having a fixed capacitance; and a parallel switch connected to the parallel fixed capacitor in series, and each of the series electrical switch capacitor modules may include: a series fixed capacitor having a fixed capacitance; and a series switch connected to the series fixed capacitor in series.

According to the embodiment of the present disclosure, the parallel mechanical vacuum variable capacitor may have a capacitance larger than the parallel fixed capacitor, and the series mechanical vacuum variable capacitor has a capacitance larger than the series fixed capacitor.

According to the embodiment of the present disclosure, the capacitance of each of the parallel mechanical vacuum variable capacitor and the series mechanical vacuum variable capacitor may be adjusted to a preset value, the preset value may be determined by a type, flux, pressure of process gas, or supplied power of the plasma processing equipment.

According to the embodiment of the present disclosure, when a process condition of the processing chamber is changed, with the capacitance of each of the parallel mechanical vacuum variable capacitor and the series mechanical vacuum variable capacitor fixed to the preset value, switching control of the parallel electrical switch capacitor modules and the series electrical switch capacitor modules may allow impedance matching.

A substrate processing method, which is performed by a plasma processing equipment according to the present disclosure, may include: adjusting an impedance of each of the first matching circuit and the second matching circuit; and performing processing with respect to the substrate when the impedance adjustment is completed, wherein the adjusting of the impedance may include: adjusting a capacitance of the mechanical vacuum variable capacitor to a preset value; measuring an input impedance of each of the first matching circuit and the second matching circuit; determining whether a reflecting coefficient from the plasma load is larger than a reference reflecting coefficient or not; measuring an impedance of the plasma load when the reflecting coefficient is larger than the reference reflecting coefficient; and adjusting a capacitance of each of the electrical variable capacitor modules by switch on-off control of the plurality of electrical variable capacitor modules on the basis of the impedance of the plasma load.

According to the embodiment of the present disclosure, the adjusting of the capacitance of each of the electrical variable capacitor modules may include: calculating an impedance adjustment value on the basis of the impedance of the plasma load; and turning on a switch of an electrical variable capacitor module having a capacitance corresponding to the impedance adjustment value, among the electrical variable capacitor modules.

According to the present disclosure, the quick matching can be performed by adopting the impedance matching circuit of the structure in which the vacuum mechanical variable capacitor and the electronic vacuum variable capacitor are connected to each other in parallel.

Furthermore, according to the present disclosure, with provision of the plurality of power supply parts and the decoupling part removing interference between the power supply parts, the operation region required for the individual matching circuit can be maintained at a low level, and thus quick impedance matching can be achieved.

The effect of the present disclosure is not limited to the above mention, and other effects not mentioned will be clearly understood by those skilled in the art from the description below.

DETAILED DESCRIPTION OF THE INVENTION

Figure 1:
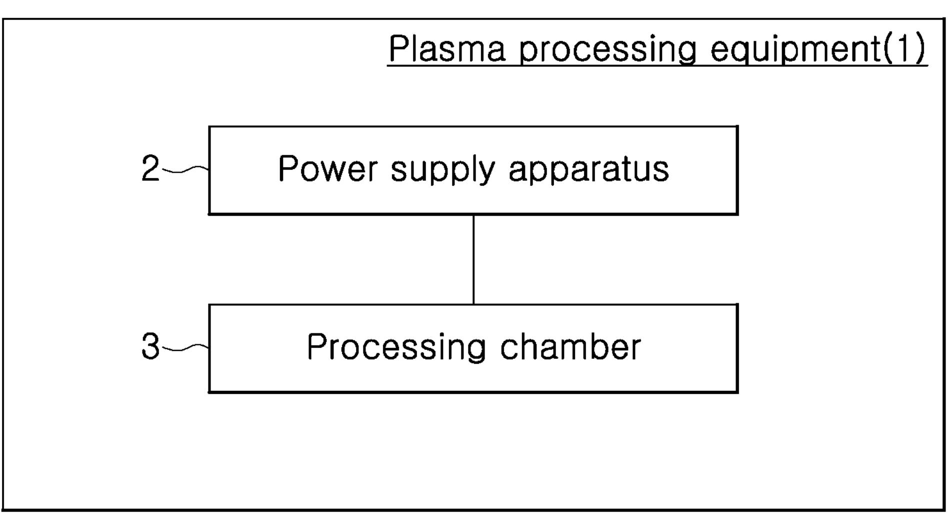
FIG. 1 is a view showing a schematic structure of plasma processing equipment.

Hereinbelow, exemplary embodiments of the present disclosure will be described in detail with reference to the accompanying drawings such that the present disclosure can be easily embodied by one of ordinary skill in the art to which the present disclosure belongs. The present disclosure may be changed to various embodiments and the scope and spirit of the present disclosure are not limited to the embodiments described hereinbelow.

In the following description, if it is decided that the detailed description of known function or configuration related to the present disclosure makes the subject matter of the present disclosure unclear, the detailed description is omitted, and the same reference numerals will be used throughout the drawings to refer to the elements or parts with same or similar function or operation.

Furthermore, in various embodiments, an element with same configuration will be described in a representative embodiment by using the same reference numeral, and different configuration from the representative embodiment will be described in other embodiment.

Other words used to describe the relationship between elements should be interpreted in a like fashion such as “between” versus “directly between”, “adjacent” versus “directly adjacent”, etc. It will be further understood that the terms “comprises”, “comprising”, “includes”, and/or “including”, when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a view showing a schematic structure of plasma processing equipment 1. The plasma processing equipment 1 includes a power supply apparatus 2 supplying power to generate plasma, and a processing chamber 3 performing processing with respect to a substrate by using plasma generated by the power supply apparatus 2. The processing chamber 3 generates the plasma to perform processing with respect to the substrate (e.g., wafer), and the power supply apparatus provides power to the processing chamber 3 so as to generate plasma.

In the processing chamber 3, a process is performed in response to a process condition while changing process gas, temperature, pressure, etc., and recently, as a high-level stacked structure is required, a plasma state change occurs for each process stage. The plasma state change causes impedance change of a plasma load and impedance mismatching may occur in response to the impedance change. Therefore, the power supply apparatus 2 performs impedance matching to minimize the impedance mismatching, and specifically, a rapid impedance matching is required to increase the efficiency of a process.

Therefore, the embodiment of the present disclosure provides a high-speed matching method having an operation region of a high power level.

FIGS. 2 to 5 are view showing a structure of the power supply apparatus 2 for high-speed matching, in the plasma processing equipment 1 according to the present disclosure.

Figure 2:
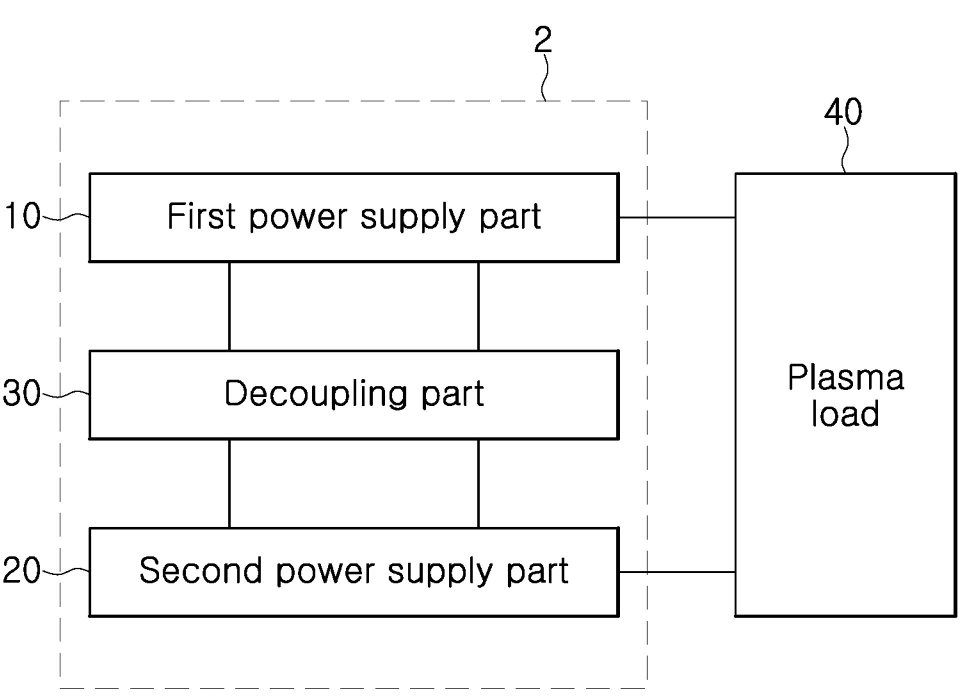
FIGS. 2 to 5 are view showing a structure of a power supply apparatus for high-speed matching to which a plurality of independent power supplies is applied, in the plasma processing equipment according to the present disclosure.
Figure 3:
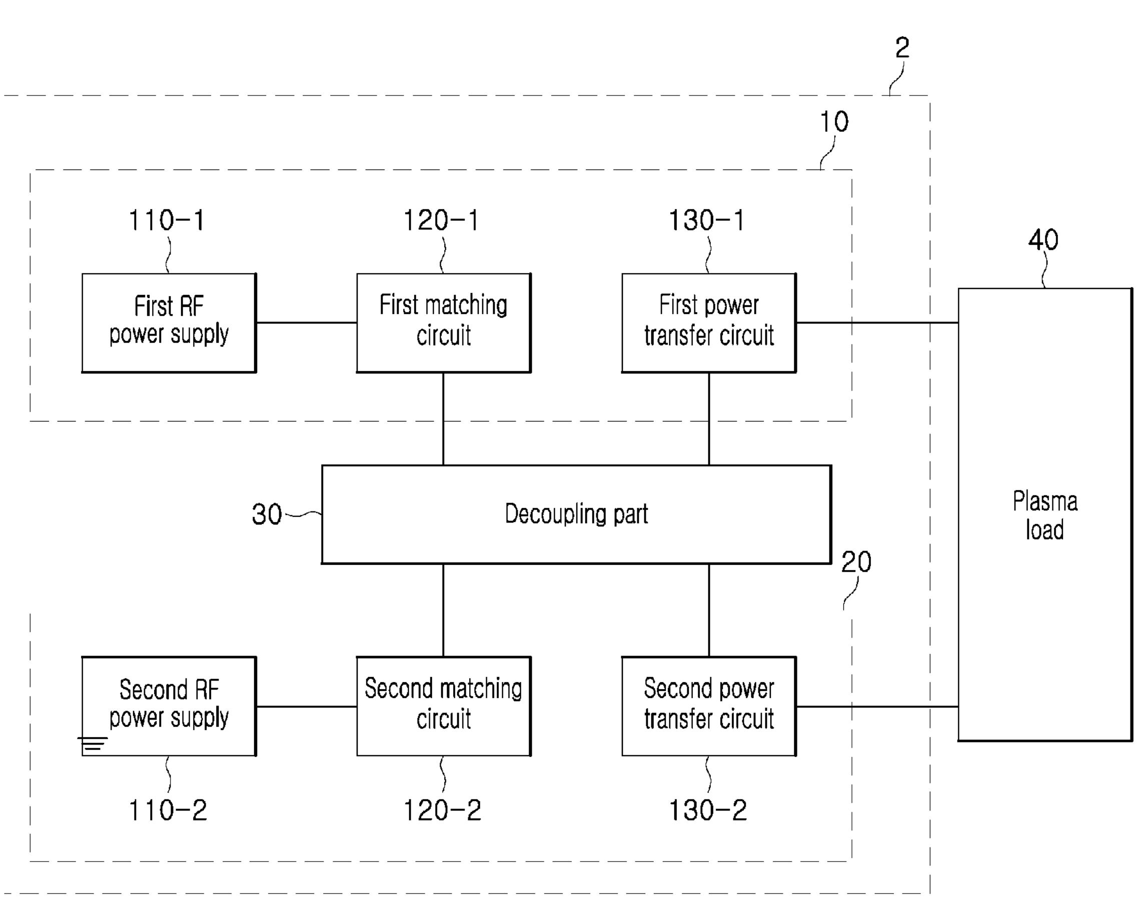

Referring to FIGS. 2 and 3, in the plasma processing equipment 1 according to the embodiment of the present disclosure, the power supply apparatus 2 for high-speed matching includes a first power supply part 10 transmitting a first RF signal to a plasma load 40, a second power supply part 20 transmitting a second RF signal to the plasma load 40, and a decoupling part 30 removing interference between the first power supply part 10 and the second power supply part 20. According to the present disclosure, the first power supply part 10 and the second power supply part 20, which are independently operated with respect to the one plasma load 40, are connected to each other in parallel. Therefore, an operation region required for a matching circuit in in the Individual power supply part may be maintained at a low level.

Figure 4:
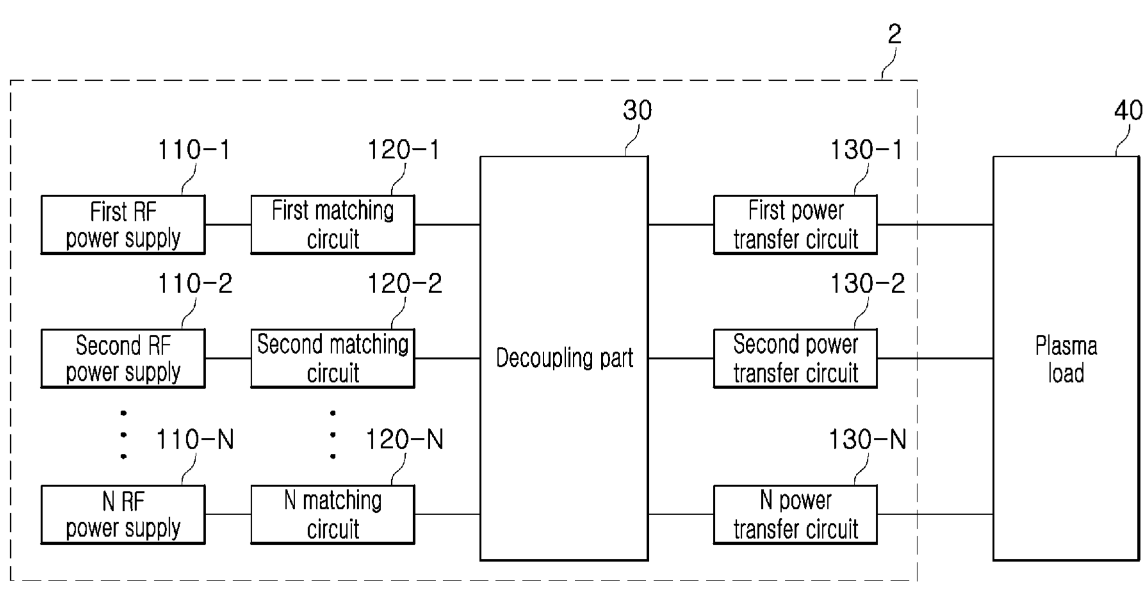

Meanwhile, N power supply parts (N is a natural number) independently operated with respect to the one plasma load 40 may be provided as shown in FIG. 4. However, in the description, for convenience of explanation, an example in which power is supplied to the plasma load 40 with 2 power supply parts will be mainly described. However, the scope of the present disclosure is not limited to the embodiment using the 2 power supply parts, and practically, the same concept can be applied to an embodiment using 3 power supply parts or more.

Figure 5:
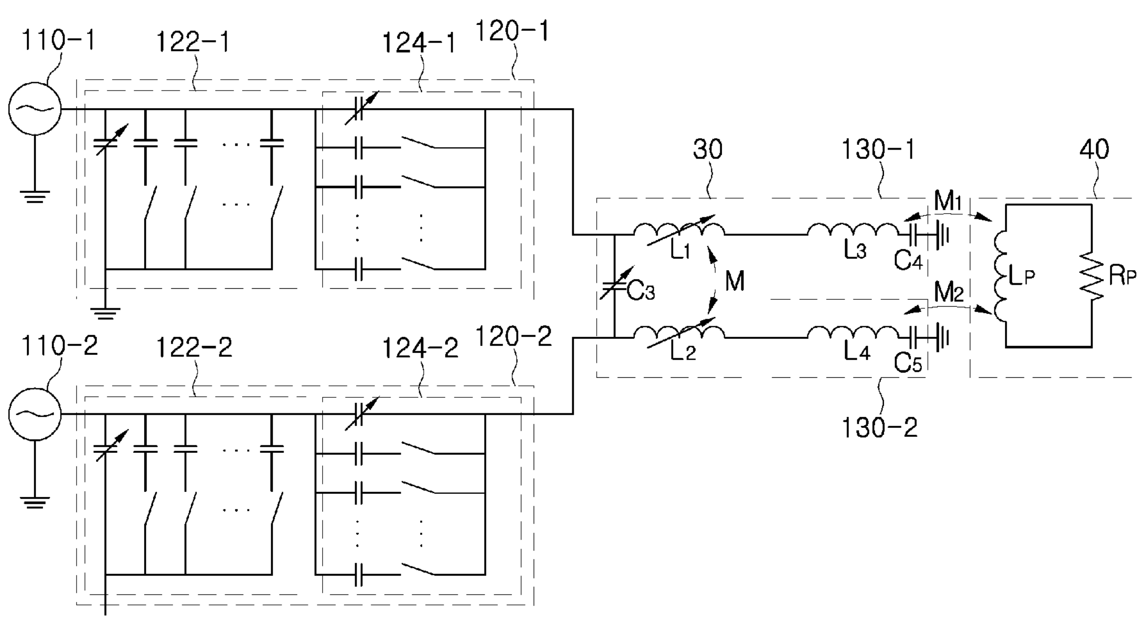

Referring to FIGS. 3 and 5, the first power supply part 10 includes a first RF power supply 110-1 generating the first RF signal, a first matching circuit 120-1 connected to the first RF power supply 110-1 and the decoupling part 30 while being located therebetween, and a first power transfer circuit 130-1 connected to the decoupling part 30 and transmitting the first RF signal to the plasma load 40. Likewise, the second power supply part 20 includes a second RF power supply 110-2 generating the second RF signal, a second matching circuit 120-2 connected to the second RF power supply 110-2 and the decoupling part 30 while being located therebetween, and a second power transfer circuit 130-2 connected to the decoupling part 30 and transmitting the second RF signal to the plasma load 40. Meanwhile, the decoupling part 30 includes a first decoupling inductor L1 connected to the first power supply part 10 in series, a second decoupling inductor L2 connected to the second power supply part 20 in series and coupled to the first decoupling inductor L1 in a mutual magnetic coupling manner, and a decoupling capacitor C3 connected to the first power supply part 10 and the second power supply part 20.

The decoupling part 30 may be configured as a part of a first matching circuit 122-1 or a second matching circuit 124-1, or as a separate module.

According to the present disclosure, the first RF signal and the second RF signal may have the same frequency or have frequencies within a reference range (e.g., 5%).

According to the present disclosure, the decoupling part 30 is designed to cancel a coupling coefficient between the first power supply part 10 (the first power transfer circuit 130-1) and the second power supply part 20 (the second power transfer circuit 130-2) and cross-talk generated by a reactance of the first power supply part 10 and a reactance of the second power supply part 20. The decoupling part 30 connects an N-port network minimizing interference between the first power supply part 10 and the second power supply part 20 to the first power supply part 10 and the second power supply part 20.

The decoupling principle of the N-port network by the decoupling part 30 will be described referring to FIGS. 6 and 7.

Figure 6:
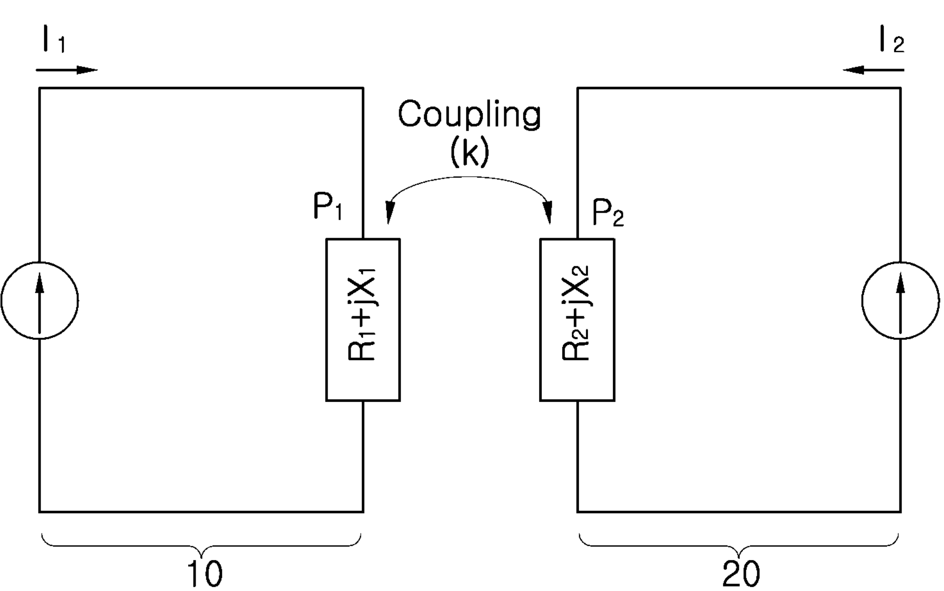
FIG. 6 is a view showing an equivalent circuit expressed by modelling a parallel power supply apparatus.

FIG. 6 is a view showing an equivalent circuit expressed by modelling a parallel power supply apparatus. A left circuit in FIG. 6 is an equivalent circuit of the first power supply part 10, and a right circuit in FIG. 7 is an equivalent circuit of the second power supply part 20.

In FIG. 6, power P1 applied to a load of the equivalent circuit of the first power supply part 10 due to electromagnetic coupling between reactive elements of an individual power supply is expressed as Equation 1 below.

$$P_1 = I_1^2 R_1 + jI_1^2 X_1 + jkI_2^2 X_2 \quad \text{[Equation 1]}$$

Figure 7:
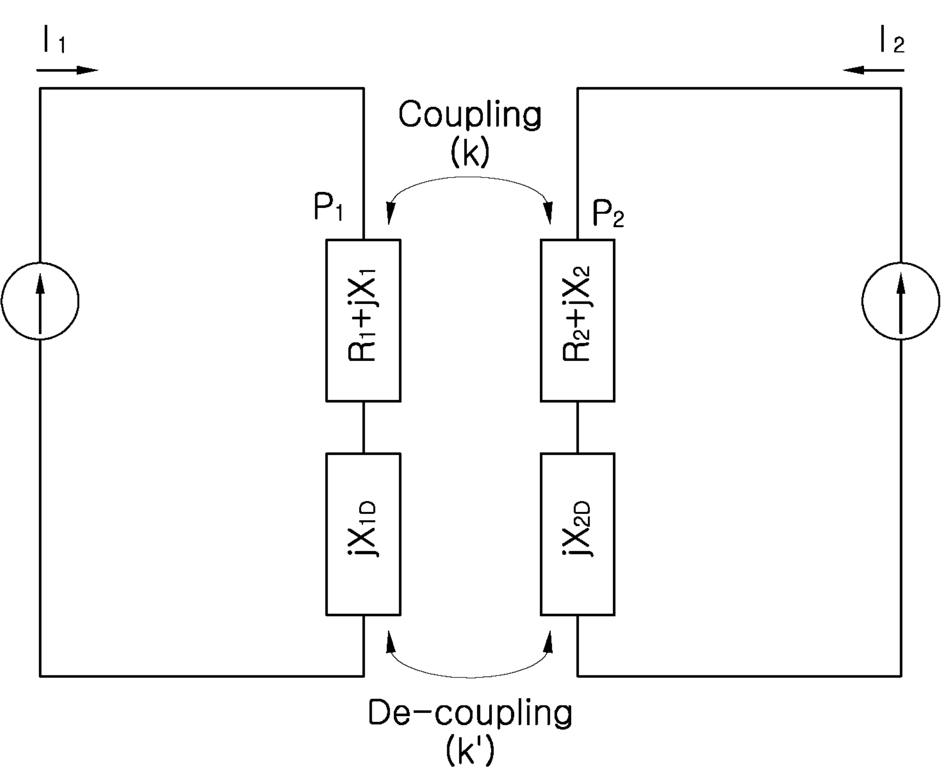
FIG. 7 is a view showing an equivalent circuit expressed by modelling a parallel power supply apparatus according to the present disclosure to which a decoupling part is applied.

Here, as shown in FIG. 7, when a reactive element generated by the decoupling part 30 is added to each circuit, power P1 applied to both of the existing load of the equivalent circuit of the first power supply part 10 and the decoupling reactive element is expressed as Equation 2 below.

$$P_1 = I_1^2 R_1 + jI_1^2 X_1 + jI_1^2 X_{1D} + jkI_2^2 X_2 + jk' I_2^2 X_{2D} \quad \text{[Equation 2]}$$

Here, the added decoupling reactive element of the decoupling part is designed to satisfy a condition as in Equation 3 below.

$$-\frac{k}{k'} = \frac{X_{2D}}{X_2} = \frac{X_{1D}}{X_1} \quad \text{[Equation 3]}$$

In Equation 1 to Equation 3, $R_1$, $X_1$ indicates an impedance component (resistance, reactance) in the equivalent circuit of the first power supply part 10, $R_2$, $X_2$ indicates an impedance component (resistance, reactance) in the equivalent circuit of the second power supply part 20, k indicates a coupling coefficient between the equivalent circuit of the first power supply part 10 and the equivalent circuit of the second power supply part 20 due to coupling between the power transfer circuits (antenna), k' indicates a coupling coefficient between a reactance added by the decoupling part 30 in the equivalent circuit of the first power supply part 10 and a reactance added by the decoupling part 30 in the equivalent circuit of the second power supply part 20 due to coupling between the inductive reactive elements (the first decoupling inductor $L_1$ and the second decoupling inductor $L_2$) in the decoupling part 30, $X_{1D}$ indicates a reactance added by the decoupling part 30 in the equivalent circuit of the first power supply part 10, and $X_{2D}$ indicates a reactance added by the decoupling part 30 in the equivalent circuit of the second power supply part 20.

Figure 8A:
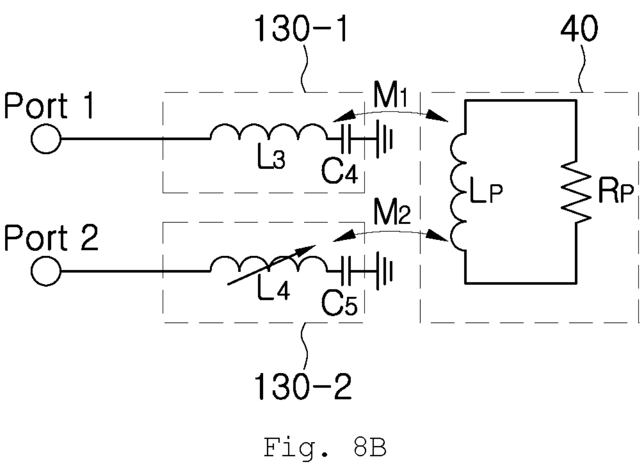
FIGS. 8A and 8B are views showing an equivalent circuit of a double power supply apparatus and a transmission coefficient of the double power supply apparatus.
Figure 8B:
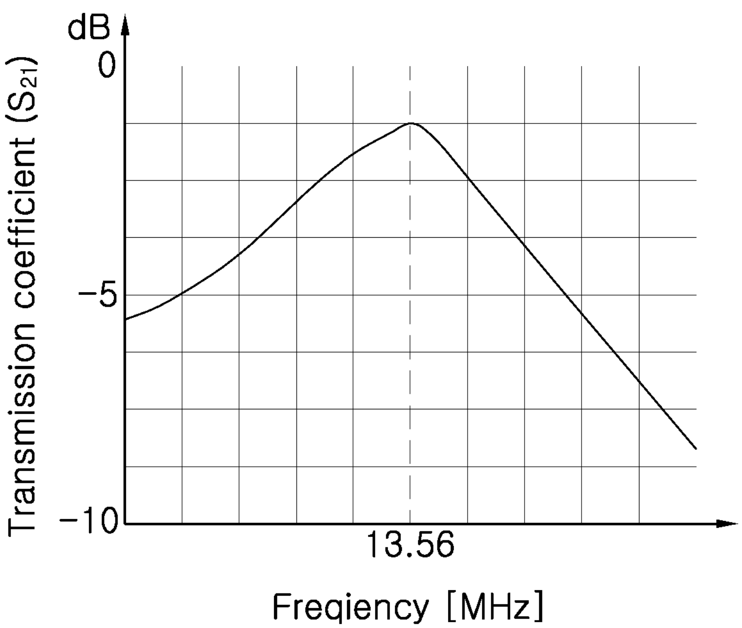

FIGS. 8A and 8B are views showing an equivalent circuit of a double power supply system and a transmission coefficient of the double power supply system. As shown in FIG. 8A, the first power transfer circuit 130-1 may be modeled of a first power transfer inductor $L_3$ and a first power transfer capacitor $C_4$, and the second power transfer circuit 130-2 may be modeled of a second power transfer inductor $L_4$ and a second power transfer capacitor $C_5$. The plasma load 40 may be modeled of the load inductor $L_P$ and a load resistor $R_P$.

FIG. 8B shows change of a transmission coefficient S21 shown in the double power supply system as in FIG. 8A. When the decoupling part is not provided, due to coupling between the power transfer circuits and an effect of the plasma load 40, a high transmission coefficient is achieved in a using frequency (13.56 MHz). However, the high transmission coefficient causes an abnormal operation by affecting the matching circuit at the opposite side, and a reflected power level of a high level is caused in the power supply system at the opposite side.

Figure 9A:
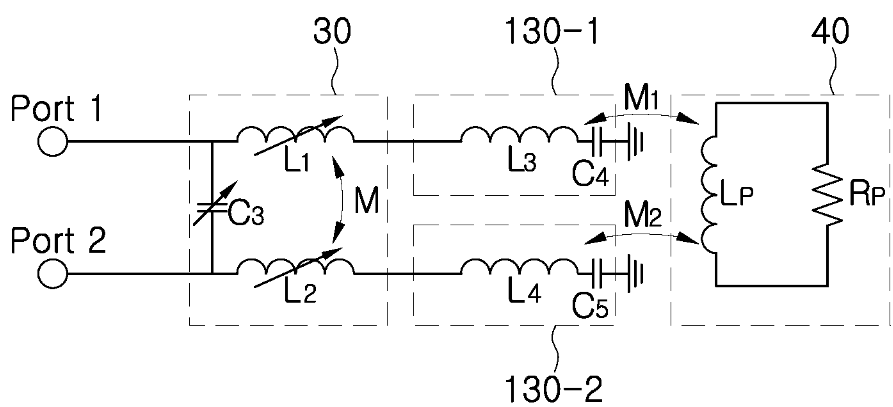
FIGS. 9A and 9B are views showing an equivalent circuit of a double power supply apparatus including a decoupling part and a transmission coefficient of the double power supply apparatus including the decoupling part.
Figure 9B:
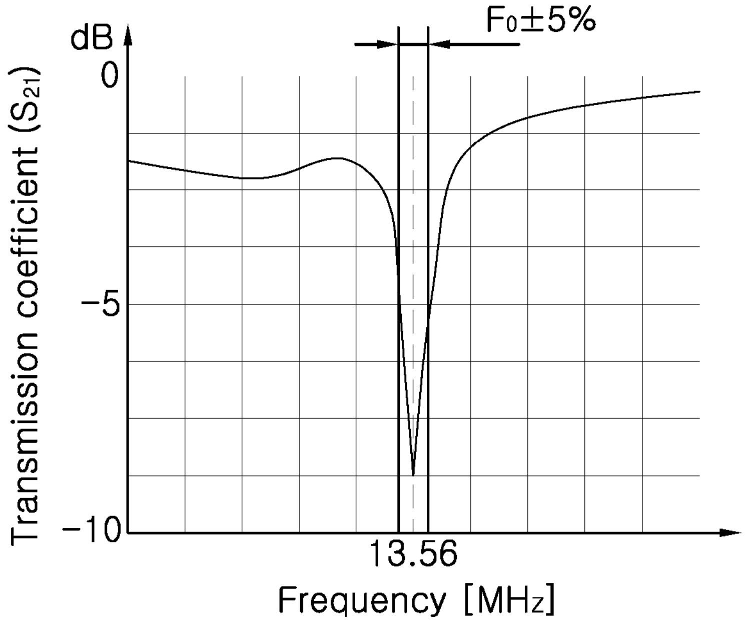

FIGS. 9A and 9B are views showing an equivalent circuit of a double power supply system including the decoupling part 30 and a transmission coefficient of the double power supply apparatus including the decoupling part. As shown in FIG. 9A, the first power transfer circuit 130-1 may be modeled of the first power transfer inductor $L_3$ and the first power transfer capacitor $C_4$, and the second power transfer circuit 130-2 may be modeled of the second power transfer inductor $L_4$ and the second power transfer capacitor $C_5$. The plasma load 40 may be modeled of the load inductor $L_P$ and a load resistor $R_P$. The decoupling part 30 is modeled of the first decoupling inductor $L_1$ connected to the first power transfer circuit 130-1, the second decoupling inductor $L_2$ connected to the second power transfer circuit 130-2, and the decoupling capacitor $C_3$ connected to the first power transfer circuit 130-1 and the second power transfer circuit 130-2.

As shown in FIG. 9A, when the decoupling part 30 consisting of the reactive element is added, it was confirmed that a low coupling coefficient exists in a region of the using frequency $f_0$. The coupling coefficient equal to or less than a predetermined level may be obtained in the same frequency as the use frequency $f_0$ or a close frequency within a 5% range.

When the independent power supply system arranged in parallel is provided according to the present disclosure, entire power is distributed and supplied to the plasma load 40, so that a region of voltage and current movement of each matching circuit 120-1, 120-2 may be reduced and change of impedance of each matching circuit 120-1, 120-2 may be minimized As the movement region and impedance change is reduced, faster impedance matching is possible.

Figure 10A:
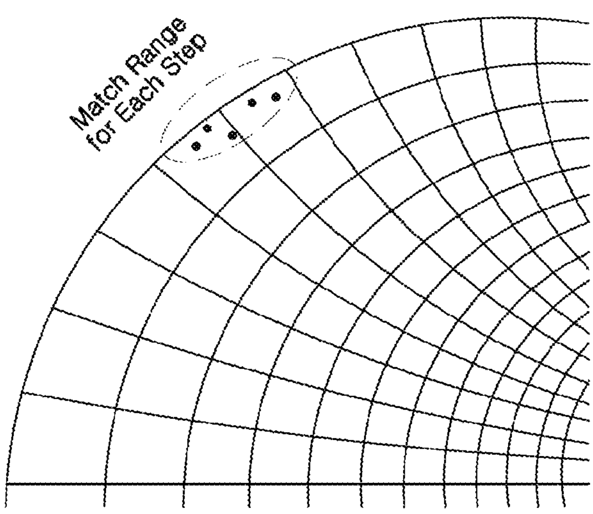
FIG. 10A is a view distribution of a plasma load impedance for each process step in a single power supply apparatus.
Figure 10B:
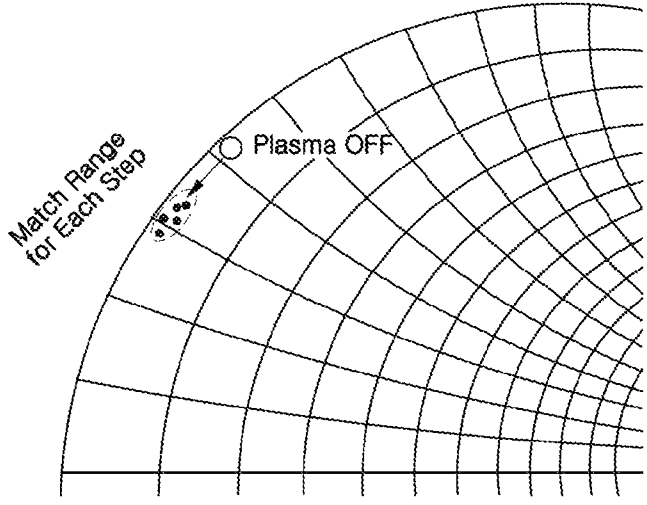
FIGS. 10B and 10C are views showing distribution of a plasma load impedance for each process step in a parallel power supply apparatus.
Figure 10C:
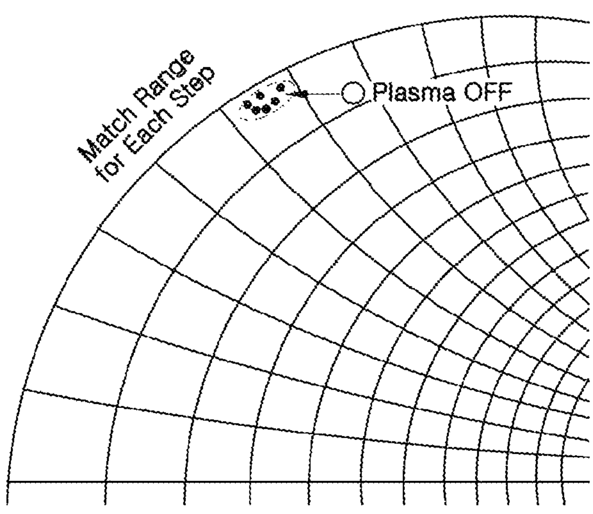

FIG. 10A is a view distribution of a plasma load impedance for each process step in a single power supply system. FIGS. 10B and 10C are views showing distribution of a plasma load impedance for each process step in a parallel power supply system. FIG. 10A is a Smith chart showing change of a load impedance in response to plasma condition change in the system in which power is supplied with one RF power supply, a matching circuit, and a splitter circuit, and FIGS. 10B and 10C are a Smith chart showing load impedance change of the first matching circuit 120-1 of the first power supply part 10 in the power supply system according to the present disclosure and a Smith chart showing load impedance change of the second matching circuit 120-2 of the second power supply part 20 in the power supply system according to the present disclosure.

In the case of the single power supply system as in FIG. 10A, it was confirmed that a distribution range of a plasma load for each process step shown in the matching circuit is relatively wide due to change of a plasma process condition, e.g., a difference in a type, flux, pressure of process gas for each process step, amount of power, etc. With a continuous etching process of a semiconductor stack structure such as a 3D NAND flash and progress of subsequence process steps, sudden change of a variable reactive element in the matching circuit is induced. The sudden change of the variable reactive element causes a shortened lifespan of the mechanical vacuum variable capacitor, and since long re-matching time increases generation time of reflected power, the lifespan of the power supply may be shortened.

On the other hand, in the case of the parallel double power supply system according to the present disclosure, as shown in FIGS. 10B and 10C, it was confirmed that impedance distribution of the plasma load 40 for each process step is narrow. As the parallel double power supply system is provided, reactance change of the plasma load 40 that an individual matching circuit should be responsible for, and each matching circuit may perform impedance matching quickly.

Figure 11:
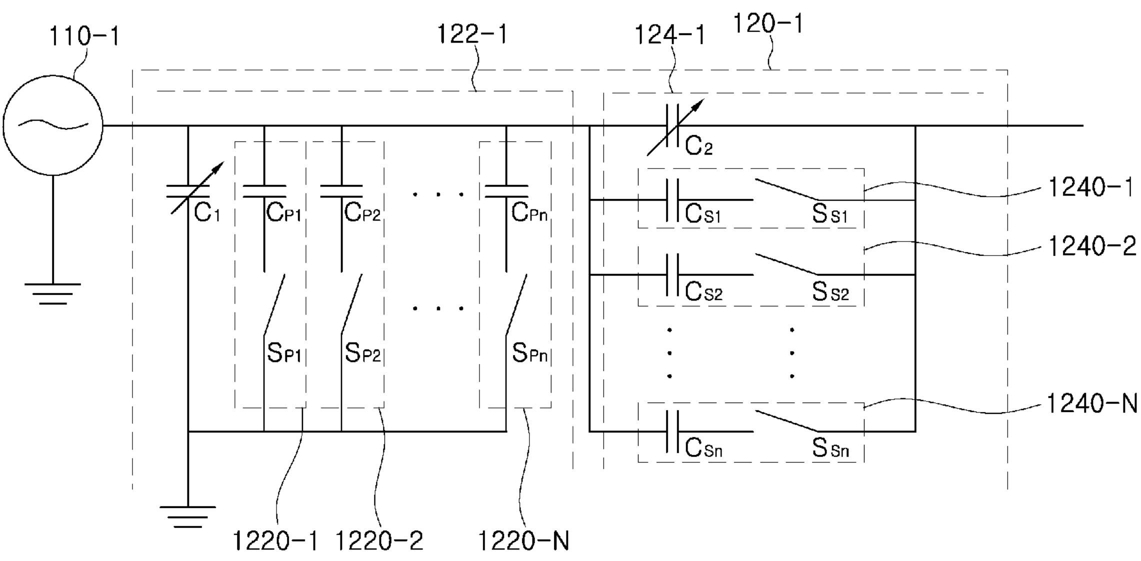
FIG. 11 is a view showing a structure of a matching circuit of the power supply apparatus for high-speed matching according to the present disclosure.

Meanwhile, as the embodiment of the present disclosure, as shown in FIG. 11, the power supply apparatus 2 having an operation region of a high power level may include an impedance matching circuit in which a mechanical vacuum variable capacitor (VVC) and an electrical variable capacitor (EVC) are arranged in parallel. Hereinbelow, a detailed structure of the impedance matching circuit according to the present disclosure will be described, and a structure of the first matching circuit 120-1 provided in the first power supply part 10 will be representatively described. However, the equal or a similar structure may be applied to the second matching circuit 120-2.

According to the present disclosure, the impedance matching circuit includes a parallel capacitor array 122-1 connected to a RF power supply 110-1 generating a RF signal in parallel, and a series capacitor array 124-1 connected to the RF power supply 110-1 in series. The parallel capacitor array 122-1 or the series capacitor array 124-1 includes a mechanical VVC C1 or C2 and an electrical switch capacitor module 1220-1, 1220-2 . . . , 220-N or 1240-1, 1240-2 . . . , 1240-N connected to the mechanical VVC C1 or C2 in parallel.

Referring to FIG. 11, the impedance matching circuit includes the parallel capacitor array 122-1, which is connected to the RF power supply 110-1 generating the RF signal and an earthing while being located therebetween, and including the parallel mechanical VVC $C_1$ and a plurality of parallel electrical switch capacitor modules 1220-1, 1220-2 . . . , and 1220-N connected to the parallel mechanical VVC $C_1$ in parallel, and the series capacitor array 124-1, which is connected to the RF power supply 110-1 and the plasma load 40 while being located therebetween, and including a series mechanical VVC $C_2$ and a plurality of series electrical switch capacitor modules 1240-1, 1240-2 . . . , and 1240-N connected to the series mechanical VVC $C_2$. In FIG. 11, both of the parallel capacitor array 122-1 and the series capacitor array 124-1 are shown as a structure consisting of a parallel connection of the mechanical VVC and the electrical switch capacitor module, but one of the parallel capacitor array 122-1 and the series capacitor array 124-1 may consist of a parallel connection of the mechanical VVC and the electrical switch capacitor module, and a remaining one may consist of the mechanical VVC.

According to the present disclosure, the parallel electrical switch capacitor module 1240-1, 1240-2 . . . , 1240-N may include a parallel fixed capacitor $C_{P1}, C_{P2} \ldots, C_{Pn}$ having a fixed capacitance, and a parallel switch $S_{P1}, S_{P2} \ldots, S_{Pn}$ connected to the parallel fixed capacitor $C_{P1}, C_{P2} \ldots, C_{Pn}$ in series.

According to the present disclosure, the parallel mechanical VVC $C_1$ may have a capacitance larger than the parallel fixed capacitor $C_{P1}$, $C_{P2}$ . . . , $C_{Pn}$. Relatively, since adjusting a capacitance of the mechanical VVC takes relatively more time than the EVC, with a fixed value of the mechanical VVC, a switch of the EVC having a relatively small capacitance is controlled, so that the capacitance adjustment may be quickly performed.

According to the present disclosure, the series electrical switch capacitor module 1240-1, 1240-2 . . . , 1240-N may include a series fixed capacitor $C_{S1}$, $C_{S2}$ . . . , $C_{Sn}$ having a fixed capacitance, and a series switch $S_{S1}$, $S_{S2}$ . . . , $S_{Sn}$ connected to the series fixed capacitor $C_{S1}$, $C_{S2}$ . . . , $C_{Sn}$ in series.

According to the present disclosure, the series mechanical VVC $C_2$ may have a capacitance larger than the series fixed capacitor $C_{S1}$, $C_{S2}$ . . . , $C_{Sn}$.

Meanwhile, the impedance matching circuit described above may be applied to the first matching circuit 120-1 and the second matching circuit 120-2 of the power supply apparatus 2 of the plasma processing equipment 1.

According to the present disclosure, the first matching circuit 120-1 includes the parallel capacitor array 122-1, which is coupled to the first RF power supply 110-1 and an earthing and includes a plurality of capacitors $C_1$, $C_{P1}$, $C_{P2}$ . . . , $C_{Pn}$ connected to each other in parallel, and the series capacitor array 124-1, which is coupled to the first RF power supply 110-1 and the decoupling part 30 and includes a plurality of capacitors $C_2$, $C_{S1}$, $C_{S2}$ . . . , $C_{Sn}$ connected to the parallel capacitor array 122-1 in series. Likewise, the second matching circuit 120-2 may include a second parallel capacitor array 122-1, which is coupled to the second RF power supply 110-2 and an earthing and includes a plurality of capacitors connected to each other in parallel, and a second series capacitor array 124-1, which is connected to the second RF power supply 110-2 and the decoupling part 30 and includes a plurality of capacitors connected to the second parallel capacitor array 122-1 in series.

The first parallel capacitor array 122-1 includes the parallel mechanical VVC $C_1$, and the plurality of parallel electrical switch capacitor modules 1220-1, 1220-2 . . . , and 1220-N connected to the parallel mechanical VVC $C_1$ in parallel. The first series capacitor array 124-1 includes the series mechanical VVC $C_2$, and the plurality of series electrical switch capacitor modules 1240-1, 1240-2 . . . , and 1240-N connected to the series mechanical VVC $C_2$ in parallel.

The parallel electrical switch capacitor module 1220-1, 1220-2 . . . , 1220-N includes the parallel fixed capacitor $C_{P1}$, $C_{P2}$ . . . , $C_{Pn}$ having a fixed capacitance, and the parallel switch $S_{P1}$, $S_{P2}$ . . . , $S_{Pn}$ connected to the parallel fixed capacitor $C_{P1}$, $C_{P2}$ . . . , $C_{Pn}$ in series. The series electrical switch capacitor module 1240-1, 1240-2 . . . , 1240-N includes the series fixed capacitor $C_{S1}$ $C_{S2}$ . . . , $C_{Sn}$ having a fixed capacitance, and the series switch $S_{S1}$, $S_{S2}$ . . . , $S_{Sn}$ connected to the series fixed capacitor $C_{S1}$, $C_{S2}$ . . . , $C_{Sn}$ in series.

The parallel mechanical VVC $C_1$ has a capacitance larger than the parallel fixed capacitor $C_{P1}$, $C_{P2}$ . . . , $C_{Pn}$. The series mechanical VVC $C_2$ has a capacitance larger than the series fixed capacitor $C_{S1}$, $C_{S2}$ . . . , $C_{Sn}$.

The total capacitance $C_{tot}$ of the first parallel capacitor array 122-1 connected to the first RF power supply 110-1 is expressed as Equation 4 below.

$$C_{tot}=C_1+C_{P1}+C_{P2}+ \ldots +C_{Pn} \quad \text{[Equation 4]}$$

Since voltages that across opposite ends of each element of the first parallel capacitor array 122-1 are the same, the amount of current passing through the entire elements is expressed as Equation 5, and when the parallel fixed capacitor $C_{P1}$, $C_{P2}$ . . . , $C_{Pn}$ connected to the parallel switch $S_{P1}$, $S_{P2}$ . . . , $S_{Pn}$ capable of being electrically controlled is smaller than the parallel mechanical VVC $C_1$, most of the RF current flows through the parallel mechanical VVC $C_1$.

$$I_{tot} = C_1\frac{dV}{dt} + C_{S1}\frac{dV}{dt} + C_{S2}\frac{dV}{dt} + \ldots + C_{Sn}\frac{dV}{dt} \quad \text{[Equation 5]}$$

The first series capacitor array 124-1 is also determined in a total capacitance and a current amount by the same principle.

As shown in FIG. 11, as the first matching circuit 120-1 is configured, the RF current passing through an individual switch is reduced, and reversely, the allowable current amount of the entire first matching circuit 120-1 may be increased. The reduction of the RF current flowing into the individual switch may reduce thermal loss of power due to inner resistance of an electrical switch and may solve a heating problem therefrom, and the operational stability of the entire first matching circuit 120-1 can be achieved. Also, the second matching circuit 120-2 adopts the same principle.

Figure 14:
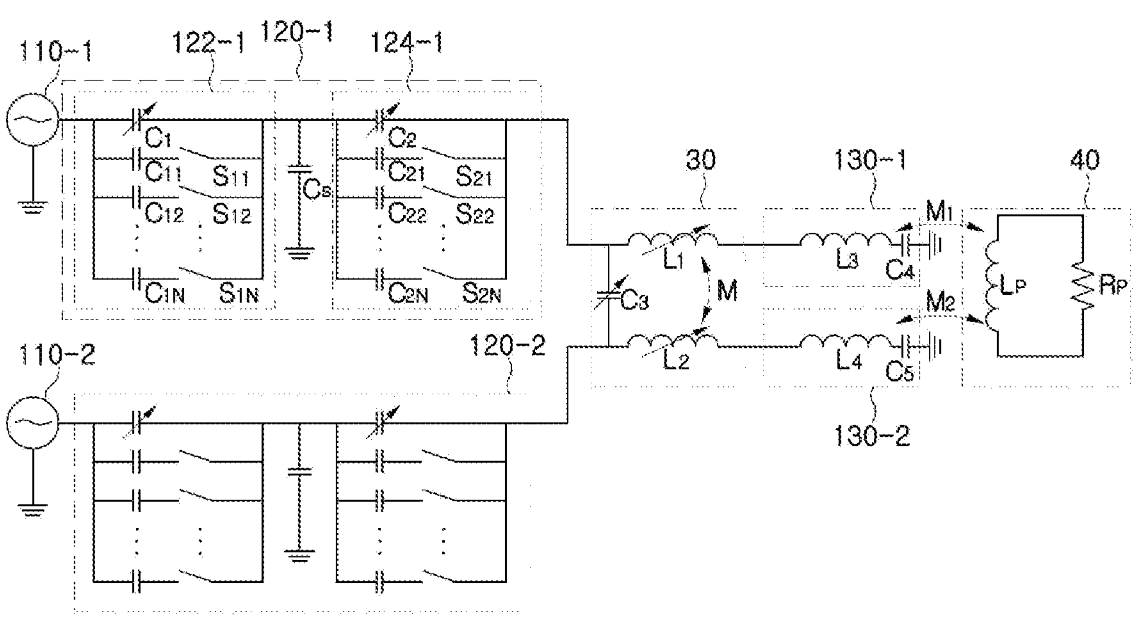
FIG. 14 is a view showing the power supply apparatus to which a matching circuit according to another embodiment of the present disclosure is applied.

Meanwhile, the impedance matching circuit according to the present disclosure may be variably configured. For example, as shown in FIG. 14, the capacitor array structure of the present disclosure may be applied to the T-shaped impedance matching circuit. Referring to FIG. 14, the first matching circuit 120-1 may include a fixed shunt capacitor $C_S$ coupled to the first RF power supply 110-1 and the earthing, the first series capacitor array 122-1 coupled to the first RF power supply 110-1 and the fixed shunt capacitor $C_S$ and including a plurality of capacitors connected to each other in parallel, and the second series capacitor array 124-1 coupled to the fixed shunt capacitor $C_S$ and the decoupling part 30 and including a plurality of capacitors connected to each other in parallel.

The first series capacitor array 122-1 includes a first mechanical VVC $C_1$, and a plurality of first parallel electrical switch capacitor modules connected to the first mechanical VVC in parallel. The second series capacitor array 124-1 includes a second mechanical VVC $C_2$, and the plurality of second parallel electrical switch capacitor modules connected to the second mechanical VVC $C_2$ in parallel. The first parallel electrical switch capacitor module includes a first fixed capacitor $C_{11}$, $C_{12}$ . . . , $C_{1N}$ and a first switch $S_{11}$, $S_{12}$ . . . , $S_{1N}$ connected to the first fixed capacitor $C_{11}$, $C_{12}$ . . . , $C_{1N}$ in series. The second parallel electrical switch capacitor module includes a second fixed capacitor $C_{12}$, $C_{22}$ . . . , $C_{2N}$ and a second switch $S_{21}$, $S_{22}$ . . . , $S_{2N}$ connected to the second fixed capacitor $C_{21}$, $C_{22}$ . . . , $C_{2N}$ in series.

Furthermore, an embodiment of the present disclosure provides a method for controlling the matching circuit for high-speed matching having an operation region of a high power level.

Figure 12:
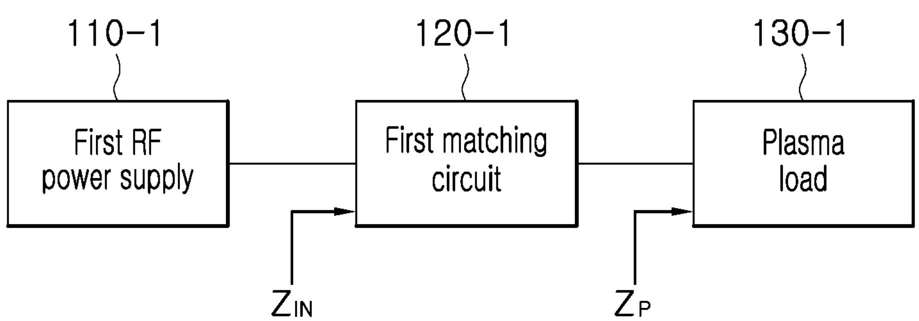
FIG. 12 is a view showing a structure of a matching system of the power supply apparatus.

FIG. 12 is a view showing a structure of a matching system of the power supply apparatus 2. Referring to FIG. 12, when the first RF power supply 110-1 is operated, an input sensor provided in the first matching circuit 120-1 measures a reflection coefficient Γ corresponding to an input impedance $Z_{IN}$. Here, when the reflection coefficient Γ is higher than a reference value, an impedance of the plasma load 40 is calculated using a controller and an impedance (capacitance) in the first matching circuit 120-1 is adjusted. After adjustment of impedance, when the reflection coefficient Γ is lower than the reference value, a process is performed without performing separate impedance adjustment. Even in performing the process, whether the input impedance $Z_{IN}$ and an output of the first RF power supply 110-1 are matched is monitored, and when the reflection coefficient Γ is higher than the reference value, a process of adjusting the impedance is repeated.

In a method of adjusting a capacitance of the mechanical VVC, a matching time is likely to be delayed due to dependence on mechanical operation. Therefore, the embodiment of the present disclosure provides a method of achieving the quick matching by the control of the electrical switch with the capacitance of the mechanical variable capacitor fixed to a preset value when the process condition of the processing chamber 3 is changed.

In other words, the plasma processing equipment 1 of according to the present disclosure includes the processing chamber 3 performing the processing with respect to the substrate, and the power supply apparatus 2 supplying power to the processing chamber 3 to generate plasma. The power supply apparatus 2 includes the first power supply part 10 including the first RF power supply 110-1 generating the first RF signal, the first matching circuit 120-1 connected to the first RF power supply 110-1, and the first power transfer circuit 130-1 transmitting the first RF signal to the plasma load 40, the second power supply part 20 including the second RF power supply 110-2 generating the second RF signal, the second matching circuit 120-2 connected to the second RF power supply 110-2, and the second power transfer circuit 130-2 transmitting the second RF signal to the plasma load 40, and the decoupling part 30 removing interference between the first power supply part 10 and the second power supply part 20. Each of the first matching circuit 120-1 and the second matching circuit 120-2 includes the mechanical VVC $C_1$ or $C_2$ and the plurality of electrical switch capacitor modules 1220-1, 1220-2 . . . , and 1220-N or 1240-1, 1240-2 . . . , and 1240-N connected to the mechanical VVC $C_1$ or $C_2$ in parallel. When the process condition of the processing chamber 3 is changed, with the capacitance of the mechanical VVC $C_1$ or $C_2$ fixed, the impedance of the first matching circuit 120-1 and the second matching circuit 120-2 is controlled by control of the electrical switch capacitor module 1220-1, 1220-2 . . . , 1220-N or 1240-1, 1240-2 . . . , 1240-N.

According to the present disclosure, the first matching circuit 120-1 includes the parallel capacitor array 122-1, which is coupled to the first RF power supply 110-1 and an earthing and includes a plurality of capacitors $C_1$, $C_{P1}$, $C_{P2}$ . . . , $C_{Pn}$ connected to each other in parallel, and the series capacitor array 124-1, which is coupled to the first RF power supply 110-1 and the decoupling part 30 and includes a plurality of capacitors $C_2$, $C_{S1}$, $C_{S2}$ . . . , $C_{Sn}$ connected to the parallel capacitor array 122-1 in series. Likewise, the second matching circuit 120-2 may include a second parallel capacitor array 122-1, which is coupled to the second RF power supply 110-2 and an earthing and includes a plurality of capacitors connected to each other in parallel, and a second series capacitor array 124-1, which is connected to the second RF power supply 110-2 and the decoupling part 30 and includes a plurality of capacitors connected to the second parallel capacitor array 122-1 in series.

The first parallel capacitor array 122-1 includes the parallel mechanical VVC $C_1$, and the plurality of parallel electrical switch capacitor modules 1220-1, 1220-2 . . . , and 1220-N connected to the parallel mechanical VVC $C_1$ in parallel. The first series capacitor array 124-1 includes the series mechanical VVC $C_2$, and the plurality of series electrical switch capacitor modules 1240-1, 1240-2 . . . , and 1240-N connected to the series mechanical VVC $C_2$ in parallel.

The parallel electrical switch capacitor module 1220-1, 1220-2 . . . , 1220-N includes the parallel fixed capacitor $C_{P1}$, $C_{P2}$ . . . , $C_{Pn}$ having a fixed capacitance, and the parallel switch $S_{P1}$, $S_{P2}$ . . . , $S_{Pn}$ connected to the parallel fixed capacitor $C_{P1}$, $C_{P2}$ . . . , $C_{Pn}$ in series. The series electrical switch capacitor module 1240-1, 1240-2 . . . , 1240-N includes the series fixed capacitor $C_{S1}$, $C_{S2}$ . . . , $C_{Sn}$ having a fixed capacitance, and the series switch $S_{S1}$, $S_{S2}$ . . . , $S_{Sn}$ connected to the series fixed capacitor $C_{S1}$, $C_{S2}$ . . . , $C_{Sn}$ in series.

The parallel mechanical VVC $C_1$ has a capacitance larger than the parallel fixed capacitor $C_{P1}$, $C_{P2}$ . . . , $C_{Pn}$. The series mechanical VVC $C_2$ has a capacitance larger than the series fixed capacitor $C_{S1}$, $C_{S2}$ . . . , $C_{Sn}$.

According to the present disclosure, the capacitance of each of the parallel mechanical VVC $C_1$ and the series mechanical VVC $C_2$ is adjusted to the preset value. The value preset as the capacitance of each of the parallel mechanical VVC $C_1$ and the series mechanical VVC $C_2$ is determined by a type, flux, pressure of process gas, or supplied power of the plasma processing equipment 1.

Figure 13A:
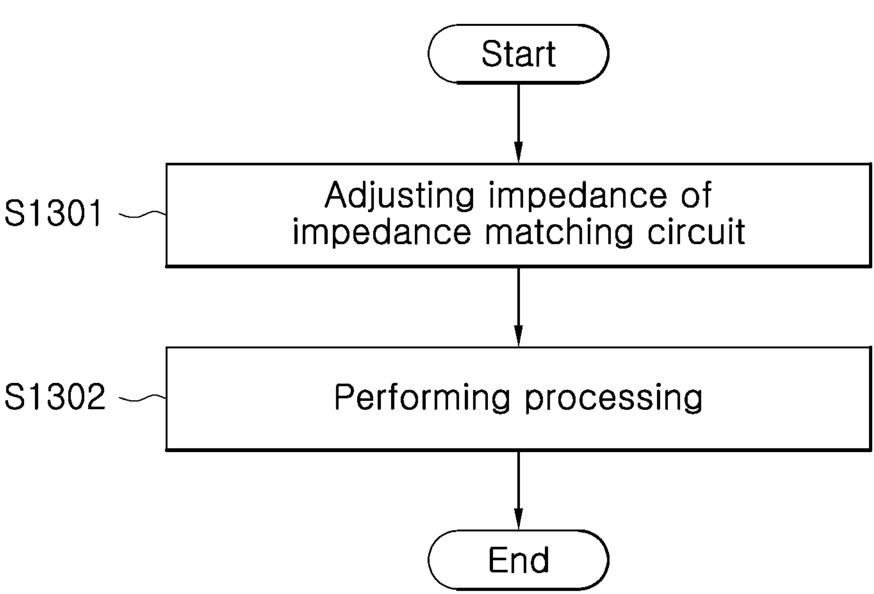
FIGS. 13A and 13B are views showing an impedance matching procedure of the power supply apparatus for high-speed matching according to the present disclosure.
Figure 13B:
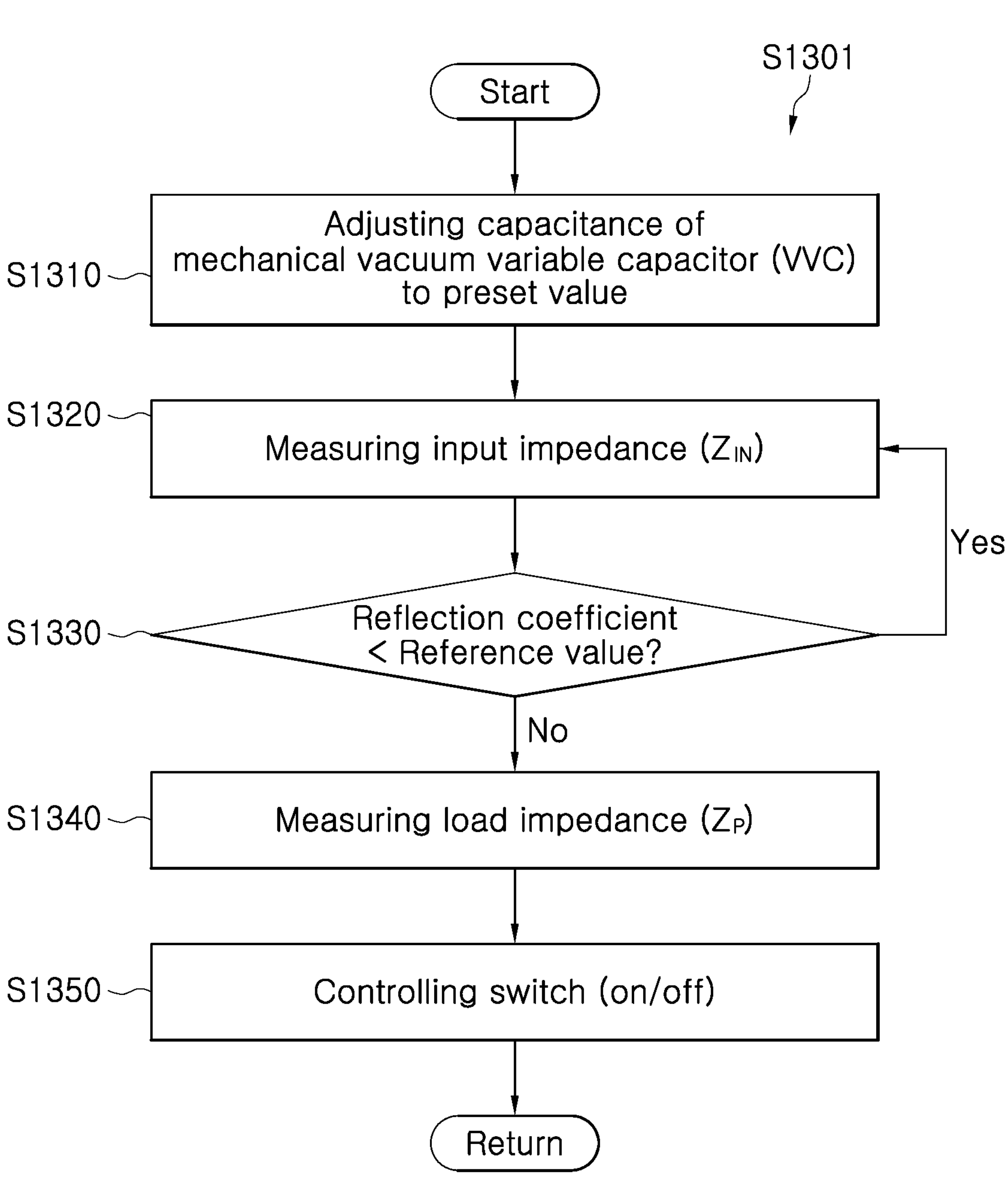

FIG. 13A is a flowchart showing a substrate processing method performed by the plasma processing equipment according to the present disclosure. FIG. 13B is a flowchart showing an impedance adjustment process according to the present disclosure.

Referring to FIG. 13A, the method includes adjusting an impedance of each of the impedance matching circuit the first matching circuit 122-1 and the second matching circuit 122-2 at S1301, and performing a processing with respect to the substrate at S1302 after the adjusting of the impedance is completed.

Referring to FIG. 13B, the adjusting of the impedance of the impedance matching circuit at S1301 includes adjusting the capacitance of the mechanical VVC $C_1$ and $C_2$ to the preset value at S1310, measuring the input impedance $Z_{IN}$ of each of the first matching circuit 122-1 and the second matching circuit 122-2 at S1320, determining whether the reflection coefficient Γ from the plasma load 40 is larger than the reference reflection coefficient or not at S1330, when the reflection coefficient Γ is larger than the reference reflection coefficient, measuring an impedance $Z_P$ of the plasma load 40 at S1340, and adjusting the capacitance of the EVC module 1220-1, 1220-2 . . . , 1220-N and 1240-1, 1240-2 . . . , 1240-N at S1350 by switching control (on/off) of the plurality of electrical switch capacitor modules 1220-1, 1220-2 . . . , and 1220-N and 1240-1, 1240-2 . . . , and 1240-N on the basis of the impedance of the plasma load 40.

In the adjusting the capacitance of the mechanical VVC to the preset value at S1310, the capacitance of each of the parallel mechanical VVC $C_1$ and the series mechanical VVC $C_2$ is adjusted to the preset value. The value preset as the capacitance of each of the parallel mechanical VVC $C_1$ and the series mechanical VVC $C_2$ is determined by a type, flux, pressure of process gas, or supplied power of the plasma processing equipment 1.

Then, the measuring of the input impedance $Z_{IN}$ at S1320 is performed. Here, the input sensor provided in the first matching circuit 120-1 measures the reflection coefficient Γ corresponding to the input impedance $Z_{IN}$.

After the reflection coefficient Γ corresponding to the input impedance $Z_{IN}$ is measured, the determining whether the reflection coefficient Γ is less than the reference value or not at S1330 is performed. When the reflection coefficient Γ is less than the reference value, the measuring of the input impedance $Z_{IN}$ at S1320 may be repeated while the processing is performed.

When the reflection coefficient Γ is larger than or equal to the reference value, the measuring of the load impedance $Z_P$ at S1340 and the adjusting of the capacitance of the EVC module 1220-1, 1220-2 . . . , 1220-N and 1240-1, 1240-2 . . . , 1240-N at S1350 by switching control (on/off) of the plurality of EVC modules 1220-1, 1220-2 . . . , and 1220-N and 1240-1, 1240-2 . . . , and 1240-N on the basis of the input impedance $Z_{IN}$ and the impedance $Z_P$ of the plasma load 40.

The adjusting of the capacitance of the EVC module 1220-1, 1220-2 . . . , 1220-N and 1240-1, 1240-2 . . . , 1240-N at S1350 may include calculating an impedance adjustment value on the basis of the impedance $Z_P$ of the plasma load 40, and turning on the switch $S_{P1}$, $S_{P2}$ . . . , $S_{Pn}$ and $C_{S1}$, $C_{S2}$ . . . , $C_{Sn}$ of the EVC module 1220-1, 1220-2 . . . , 1220-N and 1240-1, 1240-2 . . . , 1240-N having the capacitance corresponding to the impedance adjustment value.

As the method of adjusting the capacitance of the EVC module 1220-1, 1220-2 . . . , 1220-N and 1240-1, 1240-2 . . . , 1240-N, one or more switches may be turned on and remaining switches may be turned off. The capacitance of the capacitor with the turned-on switch is added to the impedance of the impedance matching circuit so that the impedance of the entire matching circuit is adjusted.

In other words, with the capacitance of each of the parallel mechanical VVC $C_1$ and the series mechanical VVC $C_2$ being fixed to the preset value, the impedance matching is achieved by switching control of the parallel electrical switch capacitor module 1220-1, 1220-2 . . . , 1220-N and the series electrical switch capacitor module 1240-1, 1240-2 . . . , 1240-N. When the impedance matching is completed, while the processing is performed, the measuring of the input impedance $Z_{IN}$ at S1320 is repeated.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific forms without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A power supply apparatus of plasma processing equipment, the power supply apparatus comprising:

a first power supply part comprising a first radio frequency (RF) power supply configured to generate a first RF signal, a first matching circuit connected to the first RF power supply, and a first power transfer circuit configured to transfer the first RF signal to a plasma load;

a second power supply part comprising a second RF power supply configured to generate a second RF signal, a second matching circuit connected to the second RF power supply, and a second power transfer circuit configured to transfer the second RF signal to the plasma load; and a decoupling part configured to remove interference between the first power supply part and the second power supply part, wherein each of the first matching circuit and the second matching circuit comprises a mechanical vacuum variable capacitor and a plurality of electrical switch capacitor modules connected to the mechanical vacuum variable capacitor in parallel, and wherein the decoupling part comprises:

a first decoupling inductor connected to the first matching circuit and the first power transfer circuit while being located therebetween;

a second decoupling inductor connected to the second matching circuit and the second power transfer circuit while being located therebetween and coupled to the first decoupling inductor in a mutually magnetic coupling manner; and a decoupling capacitor connected to the first matching circuit and the second matching circuit.

2. The power supply apparatus of claim 1, wherein the first matching circuit comprises:

a first parallel capacitor array coupled to the first RF power supply and an earthing, and comprising a plurality of capacitors connected to each other in parallel; and a first series capacitor array coupled to the first RF power supply and the decoupling part, and comprising a plurality of capacitors connected to the first parallel capacitor array in series, and the second matching circuit comprises:

a second parallel capacitor array connected to the second RF power supply and the earthing, and comprising a plurality of capacitors connected to each other in parallel; and a second series capacitor array connected to the second RF power supply and the second power transfer circuit, and comprising a plurality of capacitors connected to the second parallel capacitor array in series.

3. The power supply apparatus of claim 2, wherein the first parallel capacitor array comprises:

a parallel mechanical vacuum variable capacitor; and a plurality of parallel electrical switch capacitor modules connected to the parallel mechanical vacuum variable capacitor in parallel, and wherein the first series capacitor array comprises:

a series mechanical vacuum variable capacitor; and a plurality of series electrical switch capacitor modules connected to the series mechanical vacuum variable capacitor in parallel.

4. The power supply apparatus of claim 3, wherein each of the plurality of parallel electrical switch capacitor modules comprises:

a parallel fixed capacitor having a fixed capacitance; and a parallel switch connected to the parallel fixed capacitor in series, and wherein each of the plurality of series electrical switch capacitor modules comprises:

a series fixed capacitor having a fixed capacitance; and a series switch connected to the series fixed capacitor in series.

5. The power supply apparatus of claim 4, wherein the parallel mechanical vacuum variable capacitor has a capacitance larger than the parallel fixed capacitor, and the series mechanical vacuum variable capacitor has a capacitance larger than the series fixed capacitor.

6. The power supply apparatus of claim 1, wherein the first matching circuit comprises:

a fixed shunt capacitor coupled to the first RF power supply and an earthing;

a first series capacitor array coupled to the first RF power supply and the fixed shunt capacitor, and comprising a plurality of capacitors connected to each other in parallel; and a second series capacitor array coupled to the fixed shunt capacitor and the decoupling part, and comprising a plurality of capacitors connected to each other in parallel.

7. The power supply apparatus of claim 6, wherein the first series capacitor array comprises a first mechanical vacuum variable capacitor and a plurality of first parallel electrical switch capacitor modules connected to the first mechanical vacuum variable capacitor in parallel, and wherein the second series capacitor array comprises a second mechanical vacuum variable capacitor and a plurality of second parallel electrical switch capacitor modules connected to the second mechanical vacuum variable capacitor in parallel, wherein each of the plurality of first parallel electrical switch capacitor modules comprises a first fixed capacitor and a first switch connected to the first fixed capacitor in series, and each of the plurality of second parallel electrical switch capacitor modules comprises a second fixed capacitor and a second switch connected to the second fixed capacitor in series.

8. Plasma processing equipment comprising:

a processing chamber configured to perform processing with respect to a substrate; and a power supply apparatus configured to supply power to the processing chamber to generate plasma, wherein the power supply apparatus comprises:

a first power supply part comprising a first radio frequency (RF) power supply configured to generate a first RF signal, a first matching circuit connected to the first RF power supply, and a first power transfer circuit configured to transfer the first RF signal to a plasma load;

a second power supply part comprising a second RF power supply configured to generate a second RF signal, a second matching circuit connected to the second RF power supply, and a second power transfer circuit configured to transfer the second RF signal to the plasma load; and a decoupling part configured to remove interference between the first power supply part and the second power supply part, wherein each of the first matching circuit and the second matching circuit comprises a mechanical vacuum variable capacitor and a plurality of electrical variable capacitor modules connected to the mechanical vacuum variable capacitor in parallel, and wherein, when a process condition of the processing chamber is changed, as the plurality of electrical variable capacitor modules are controlled while a capacitance of the mechanical vacuum variable capacitor is fixed, an impedance of each of the first matching circuit and the second matching circuit is adjusted, wherein the first matching circuit comprises:

a first parallel capacitor array comprising a plurality of capacitors connected to each other in parallel; and a first series capacitor array comprising a plurality of capacitors connected to the first parallel capacitor array in series, and wherein the second matching circuit comprises:

a second parallel capacitor array comprising a plurality of capacitors connected to each other in parallel; and a second series capacitor array comprising a plurality of capacitors connected to the second parallel capacitor array in series.

9. The plasma processing equipment of claim 8, wherein the first parallel capacitor array comprises:

a parallel mechanical vacuum variable capacitor; and a plurality of parallel electrical switch capacitor modules connected to the parallel mechanical vacuum variable capacitor in parallel, and the first series capacitor array comprises:

a series mechanical vacuum variable capacitor; and a plurality of series electrical switch capacitor modules connected to the series mechanical vacuum variable capacitor in parallel.

10. The plasma processing equipment of claim 9, wherein each of the plurality of parallel electrical switch capacitor modules comprises:

a parallel fixed capacitor having a fixed capacitance; and a parallel switch connected to the parallel fixed capacitor in series, wherein each of the plurality of series electrical switch capacitor modules comprises:

a series fixed capacitor having a fixed capacitance; and a series switch connected to the series fixed capacitor in series, wherein the parallel mechanical vacuum variable capacitor has a capacitance larger than the parallel fixed capacitor, and wherein the series mechanical vacuum variable capacitor has a capacitance larger than the series fixed capacitor.

11. The plasma processing equipment of claim 10, wherein the capacitance of each of the parallel mechanical vacuum variable capacitor and the series mechanical vacuum variable capacitor is adjusted to a preset value, wherein the preset value is determined by a type, flux, pressure of process gas, or supplied power of the plasma processing equipment, and wherein, when a process condition of the processing chamber is changed, with the capacitance of each of the parallel mechanical vacuum variable capacitor and the series mechanical vacuum variable capacitor fixed to the preset value, switching control of the plurality of parallel electrical switch capacitor modules and the plurality of series electrical switch capacitor modules allows impedance matching.

12. A substrate processing method, which is performed by the plasma processing equipment according to claim 8, the substrate processing method comprising:

adjusting an impedance of each of the first matching circuit and the second matching circuit; and performing processing with respect to the substrate when the adjusting of the impedance is completed, wherein the adjusting of the impedance comprises:

adjusting a capacitance of the mechanical vacuum variable capacitor to a preset value;

measuring an input impedance of each of the first matching circuit and the second matching circuit;

determining whether a reflecting coefficient from the plasma load is larger than a reference reflecting coefficient or not;

measuring an impedance of the plasma load when the reflecting coefficient is larger than the reference reflecting coefficient; and adjusting a capacitance of each of the plurality of electrical variable capacitor modules by switch on-off control of the plurality of electrical variable capacitor modules on the basis of the impedance of the plasma load.

13. The substrate processing method of claim 12, wherein the adjusting of the capacitance of each of the plurality of electrical variable capacitor modules comprises:

calculating an impedance adjustment value on the basis of the impedance of the plasma load; and turning on a switch of an electrical variable capacitor module having a capacitance corresponding to the impedance adjustment value, among the plurality of electrical variable capacitor modules.

* * * * *